United States Patent [19]

Kim

[11] Patent Number: 5,786,721
[45] Date of Patent: Jul. 28, 1998

[54] PULSE-SHAPING CIRCUIT

[75] Inventor: Byeong-Il Kim, Pucheon, Rep. of Korea

[73] Assignee: Samsung Electronics, Co., Ltd., Suwon, Rep. of Korea

[21] Appl. No.: 741,863

[22] Filed: Oct. 30, 1996

[30] Foreign Application Priority Data

Oct. 31, 1995 [KR] Rep. of Korea ............... 1995-38681

[51] Int. Cl.$^6$ ............................................. H03K 5/08
[52] U.S. Cl. ..................... 327/321; 327/299; 327/325; 327/327
[58] Field of Search ........................... 237/309, 315, 237/318, 321, 325, 327, 331, 299, 482, 484

[56] References Cited

U.S. PATENT DOCUMENTS 5,034,600  7/1991  Fukuyama ........................ 327/514
5,404,333  4/1995  Mehta ............................. 327/309
5,418,411  5/1995  Michel et al. ................... 327/309

Primary Examiner—Terry Cunningham
Assistant Examiner—Terry L. Englund
Attorney, Agent, or Firm—Marger, Johnson, McCollom, & Stolowitz P.C.

[57] ABSTRACT

A pulse-shaping circuit comprises a current limiter, which is connected in parallel with a voltage divider, for limiting a source voltage and enabling first and second voltage signals divided by the voltage divider to be constantly maintained, and an output voltage limiter which is provided to prevent a collector voltage of an output switching transistor from being increased to more than 0.1 V, so that an output pulse signal from an output terminal thereof may be lowered nearly to about 0.1 V when a low input pulse signal is applied to an input terminal thereof.

10 Claims, 4 Drawing Sheets 3,786,721

PULSE-SHAPING CIRCUIT

BACKGROUND OF THE INVENTION

1. Field of the Invention

The present invention relates to a pulse-shaping circuit adapted to a preamplifier for a remote control receiver, and more particularly to a pulse-shaping circuit capable of producing an output pulse signal nearly to a ground level when an input pulse signal thereof is at low level.

2. Description of Prior Art

In general, a preamplifier is embodied in a receiver of an electronic product such as television set, VCR (video camera recorder), audio system, air conditioner or the like, to modulate a pulse signal from a transmitter and generate a modulated pulse signal. The preamplifier is typically implemented with several types of filters, that is, a band pass filter, a band reject filter and the like, so as to alternate selected frequencies of noise included in the modulated pulse signal. The pulse signal filtered by the filters is applied to a pulse-shaping circuit, whereby to be pulse-shaped.

As shown in FIG. 1, a prior art pulse-shaping circuit comprises two PNP transistors Q1 and Q2, one NPN transistor Q3 and four resistors R1–R4. The PNP transistor Q1, which serves as an input switching element, is conductive when an input pulse signal applied to the input terminal 1 of the circuit is at low level, so that a current flow path is formed through the resistors R1–R3 connected in series between power and ground sources $V_{CC}$ and GND. The resistors R1–R3 serve as a voltage divider which outputs a first voltage signal at a junction of the resistors R1 and R2 and a second voltage signal at a junction of the resistors R2 and R3 while current is flowing through transistor Q1. When current is flowing in the path formed by the Q1-R1-R2-R3 series circuit, the NPN transistor Q3 serving as an output switching element is activated in accordance with the second voltage signal applied through the base thereof. The first voltage signal is applied to the emitter of the PNP transistor Q2 serving as a voltage limiter. The collector of transistor Q3 is directly connected to an output terminal 3 of the circuit and also commonly to the base and collector of the transistor Q2. A load resistor R4 is connected between the power source $V_{CC}$ and the output terminal 3. The transistor Q2 outputs a saturation current through the collector thereof to the collector of the transistor Q3 and limits an output pulse signal of the output terminal 3 to prevent it from being increased to more than constant voltage level.

In the above-described pulse-shaping circuit, the output pulse signal of low level is dependent upon the collector voltage of the saturated transistor Q3. Therefore, a large amount of current is required for the saturation of the transistor Q3. During saturation of the transistor Q3, the collector voltage thereof then is increased, thereby resulting in an increase in the low level voltage of the output pulse signal.

When a pulse signal of high level, as shown in FIG. 3A, is applied to the input terminal 1 of the circuit, since the output pulse signal having voltage level of about 5 V is generated from the output terminal 3, there are no problems in an external circuit connected with the prior art pulse-shaping circuit. However, when an input pulse signal of low level, as shown in FIG. 3A, is applied to the input terminal 1, the output pulse signal having a low voltage level of above 0.4 V is generated, as shown in FIG. 3B, from the output terminal 3. Then, since the low level signal has a relatively high potential as shown in FIG. 3B, there is the problem that a sufficient signal margin cannot be obtained in the external circuit at the following stage. This is because the output pulse signal having a low voltage level of more than 0.4 V is provided to the external circuit. It is well-known in the art that, when an external circuit connected to the following stage receives a pulse signal as near to ground level as possible, a maximum signal margin can be obtained from the external circuit.

SUMMARY OF THE INVENTION

Accordingly, it is the object of the present invention to provide a pulse-shaping circuit capable of producing an output pulse signal having a low voltage near to a ground level when an input pulse signal thereof is at low level.

According to the aspect of the present invention, the pulse-shaping circuit adapted to a preamplifier which is embodied in a receiver for remote control, comprises first switching means for receiving an input pulse signal through an input terminal of said circuit and forming a current flow path between first and second power sources in accordance with a voltage level of said input pulse signal, and voltage dividing means for dividing a source voltage applied through said first switching means into first and second voltage signals while said current flow path is formed. A loading resistor is connected in series to said first power source and in parallel with said first switch means. Second switching means responsive to said second voltage signal, provides an output pulse signal from an output terminal of said circuit to an external circuit. A current limiting means constantly limits the amount of current flowing through said voltage dividing means, enabling said first and second voltage signals to be constantly maintained. An output voltage limiting means supplying a saturating current signal for said second switching means limits a voltage level of said output pulse signal in accordance with said first voltage signal, whereby said voltage level of said output pulse signal is lowered to about 0.1 volt when said input pulse signal is at low level.

In this circuit, said current limiting means preferably comprises two diodes connected in series to each other. Each of said two diodes comprises an NPN transistor in which a base and a collector thereof are directly connected to each other.

In this circuit, said output voltage limiting means preferably comprises an NPN transistor having a base receiving said first voltage signal, a collector connected to said first switching means and an emitter connected to said output terminal of said circuit.

In this circuit, said first switching means preferably comprises a PNP transistor having an emitter connected to said first power source, a base receiving said input pulse signal of said circuit, and a collector connected to provide a collector voltage thereof to said voltage dividing means.

In this circuit, said voltage dividing means preferably comprises first, second and third resistors connected in series between the collector of said PNP transistor serving as said first switching means and said second power source, and wherein said first voltage signal is generated from a connection point between said first and second resistors and said second voltage signal is generated from a connection point between said second and third resistors.

In this circuit, said second switching means preferably comprises an NPN transistor having an emitter connected to said second power source, a base receiving said second voltage signal, and a collector connected commonly to said load resistor and said output terminal of said circuit.

BRIEF DESCRIPTION OF THE DRAWINGS

This invention may be better understood and its object will become apparent to those skilled in the art by reference to the accompanying drawings as follows.

DETAILED DESCRIPTION

Figure 1:
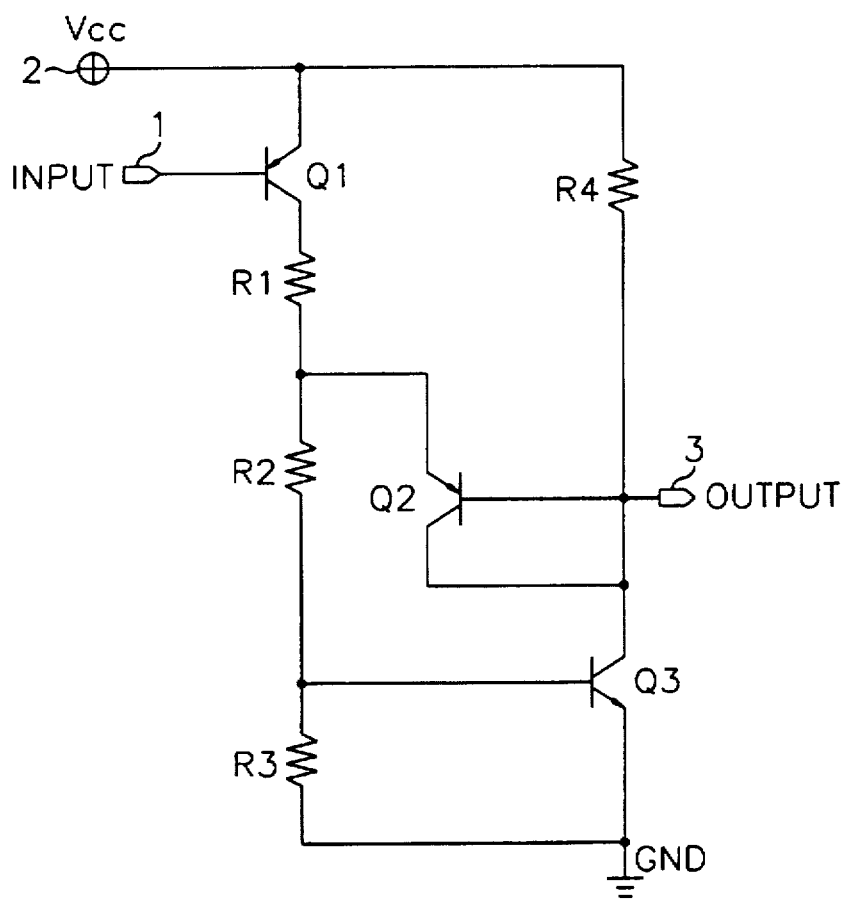
FIG. 1 is a circuit diagram illustrating a prior art pulse-shaping circuit.
Figure 2:
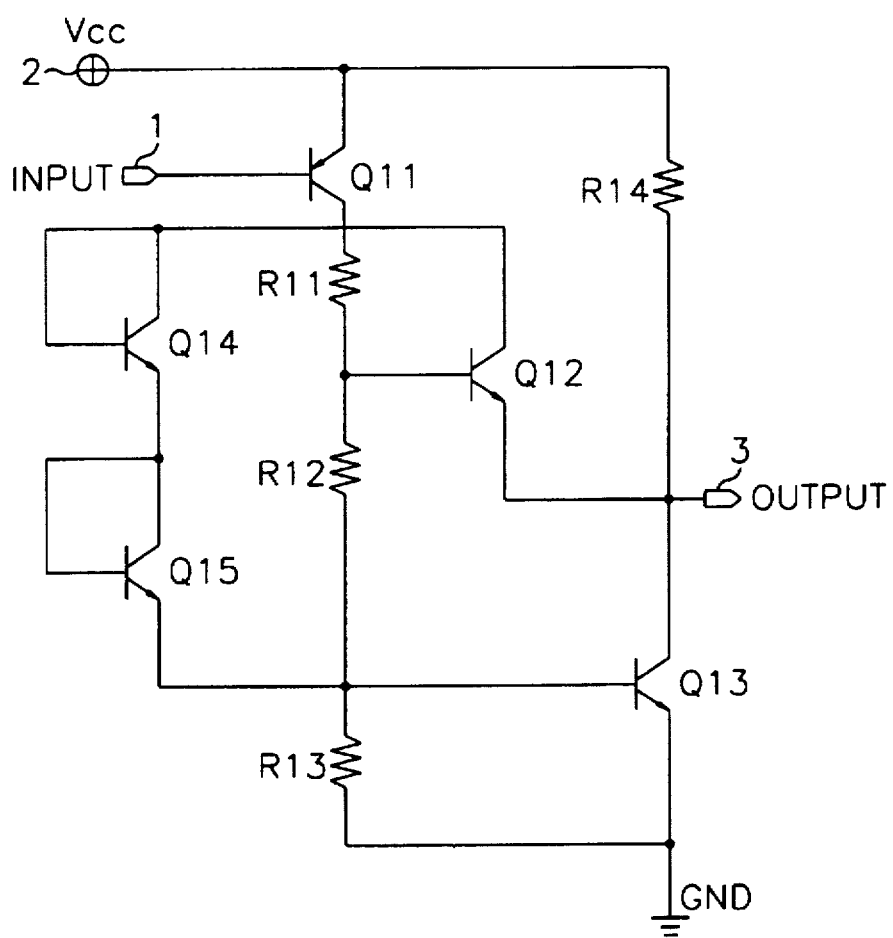
FIG. 2 is a circuit diagram illustrating a pulse-shaping circuit in accordance with the present invention.
Figure 3A:
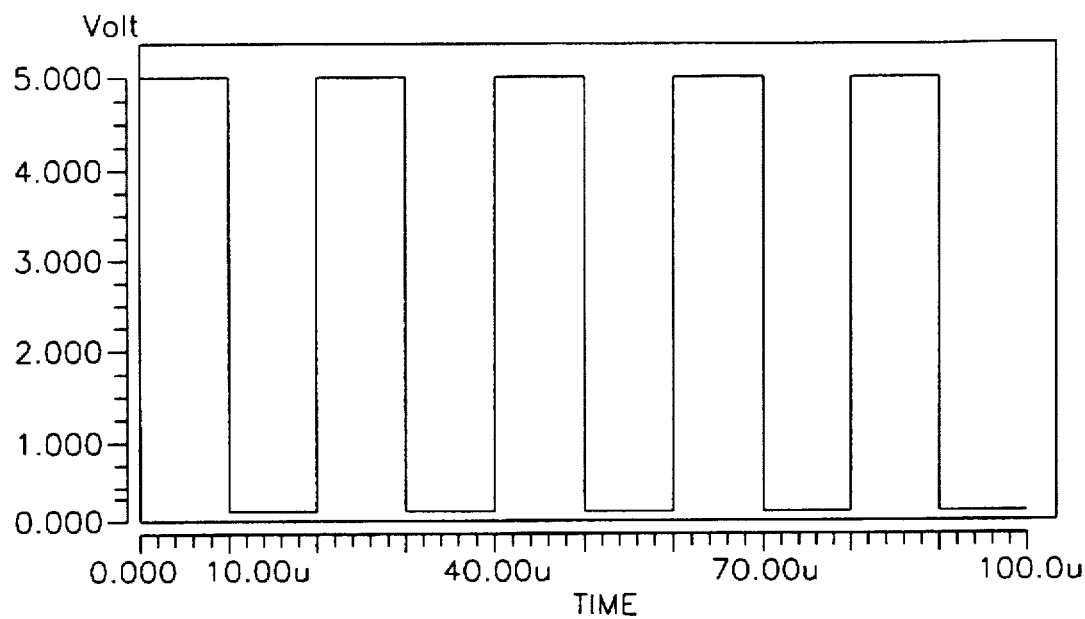
FIGS. 3A and 3B are diagrams showing waveforms of input and output pulse signals in the pulse-shaping circuit of FIG. 1.
Figure 3B:
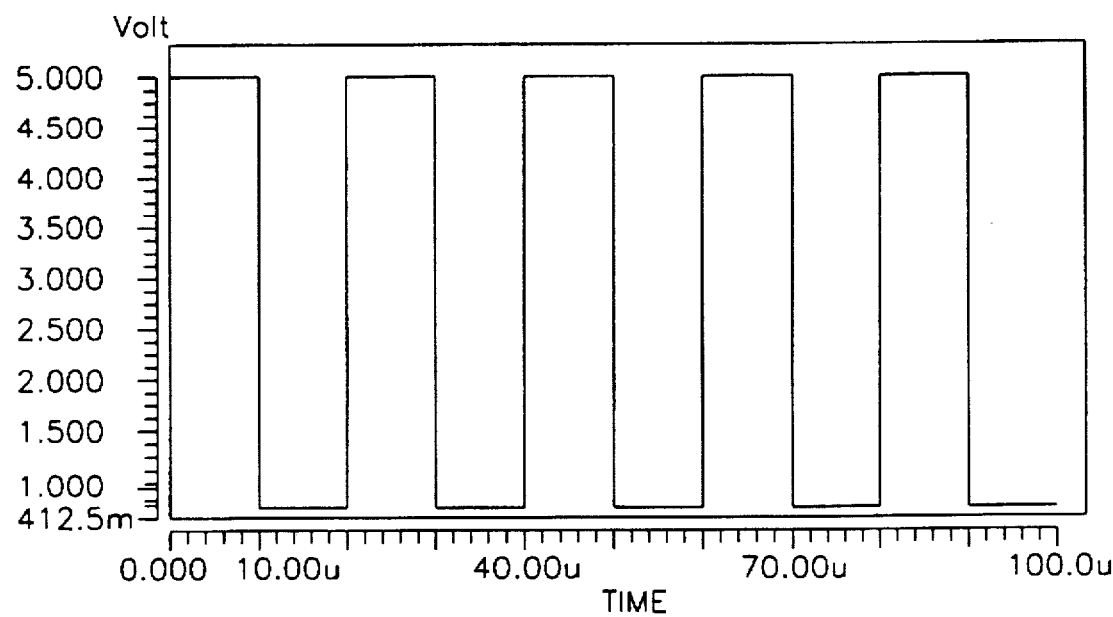

Referring to FIG. 2, the novel pulse-shaping circuit in accordance with the present invention comprises a voltage divider for dividing a source voltage into two voltage signals during forming a current flow path therethrough by applying an input pulse signal of low level to an input terminal 1 thereof, and a current limiter for constantly limiting the amount of current flowing through the voltage divider and enabling the two voltage signals to be maintained nearly constant, so that an output pulse signal from an output terminal 3 of the circuit can be lowered nearly to about 0.1 V even though a switching transistor Q13 having a collector connected to the output terminal 3 is saturated.

As again shown in FIG. 2, the pulse-shaping circuit has one PNP transistor Q11 serving as an input switching element, four NPN transistors Q12 through Q15, and four resistors R11 through R14. The PNP transistor Q11 constitutes a first switching element which is conductive in accordance with a voltage level of the input pulse signal and provided to form a current flow path between power source 2 and ground GND when the input pulse signal is at low level. The base of PNP transistor Q11 is connected to the input terminal 1 of the circuit to receive the input pulse signal; the emitter thereof is connected to the power source 2 and the collector thereof is connected through the voltage divider to the ground GND.

The voltage divider is constituted by the resistors R11–R13 which are connected in series between the collector of the transistor Q11 and the ground GND, and serves to divide a source voltage $V_{CC}$ from the power source 2 into two different voltage signals. One of them, a first voltage signal, is generated at a connection node between the resistors R11 and R12 and the other, a second voltage signal, is generated at a connection node between the resistors R12 and R13.

The NPN transistor Q12, which receives the first voltage signal through the base thereof, constitutes an output voltage limiter which supplies a saturating current to the collector of the NPN transistor Q13 serving as a switching element and limits the voltage level of an output pulse signal nearly to about 0.1 V. The emitter of the transistor Q12 is commonly connected to the output terminal 3 and the collector of the transistor Q13, and the collector thereof is connected to the collector of the transistor Q11.

The transistor Q13 constitutes a second switching element which is conductive in response to the second voltage signal through the base thereof so as to provide the output pulse signal corresponding to the input pulse signal from the input terminal 1. The resistor R14 is connected between the collector of the transistor Q13 and the power source 2, to serve as a load resistor.

The transistors Q14 and Q15 connected in series between the collector of the transistor Q11 and the connection node of the resistors R12 and R13, constitute a current limiter which constantly limits the amount of current flowing through the resistors R11 through R13 serving as the voltage divider. Transistors Q14 and Q15 enable the first and second voltage signals to be maintained constant, because the current limiter is connected in parallel with the voltage divider.

Operation of the pulse-shaping circuit according to the present invention will be hereinafter described in detail with reference to FIGS. 2 and 4.

Figure 4A:
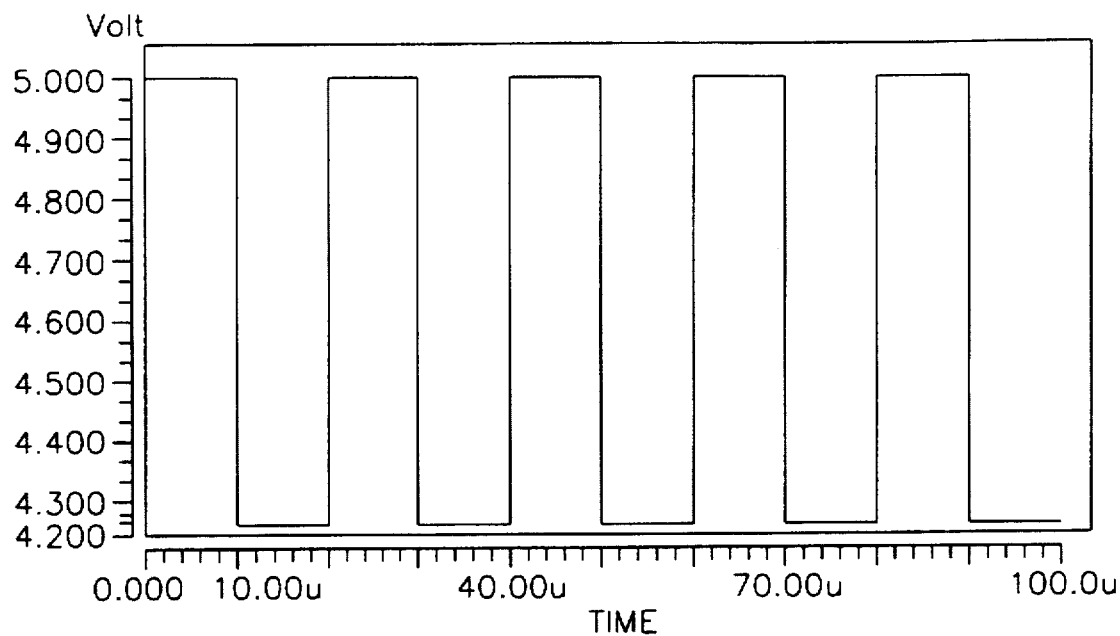
FIGS. 4A and 4B are diagrams showing waveforms of input and output pulse signals in the pulse-shaping circuit of FIG. 3.
Figure 4B:
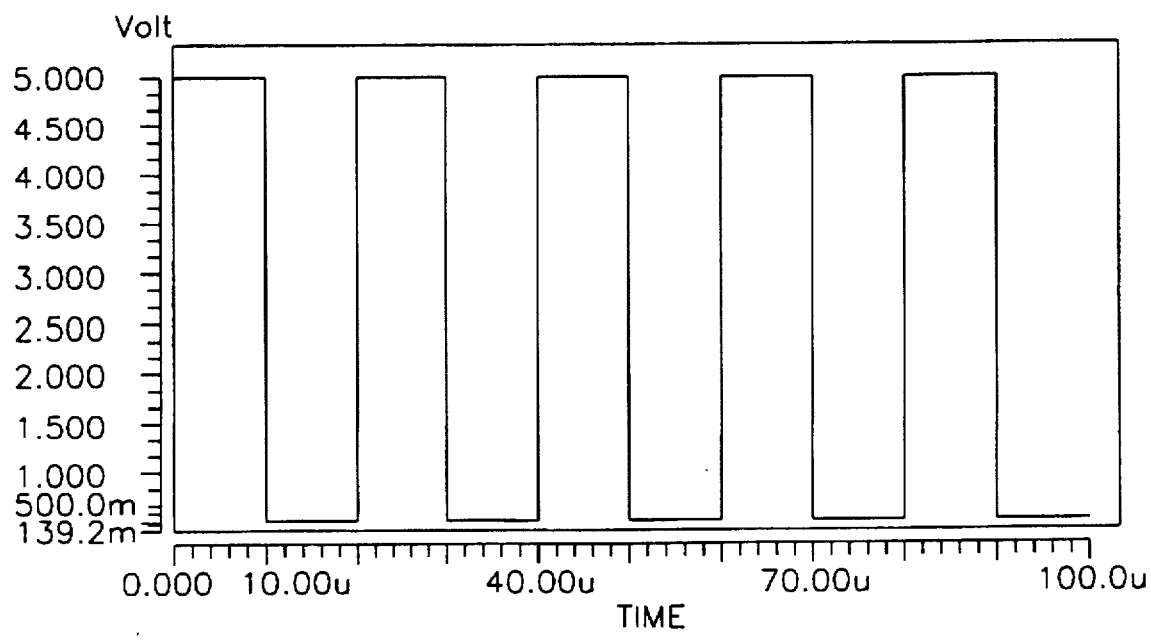

When an input pulse signal of low level, as shown in FIG. 4A, is applied to the input terminal 1 of FIG. 2, the PNP transistor Q11 is conductive to form a current flow path between the first switching element Q11 and ground GND. Collector current $I_{CQ11}$ of the PNP transistor Q11 flows through the voltage dividing resistors R11, R12 and R13, and also through the transistors Q14 and Q15. The transistors Q14 and Q15 serving as a current limiter enable the amount of current flowing through the resistors R11 and R12 to be maintained constant, and thus a voltage drop occurring across the resistors R11 and R12 can be maintained constant. Each of the transistors Q14 and Q15 functions as a diode because the base and collector thereof are commonly connected. Also, one or more zener diodes may be substituted for the transistors Q14 and Q15.

In the circuit shown in FIG. 2, the collector current $I_{CQ11}$ of the transistor Q11 can be obtained by using the following equation (1):

$$I_{CQ11} = I_{SQ11} \times \exp\left(\frac{V_{BE}}{V_T}\right) \quad (1)$$

In equation (1) $I_{SQ11}$ is the collector saturation current of the transistor Q11, $V_{BE}$ the base-emitter voltage thereof and $V_T$ the thermal voltage thereof. Since $V_{BE}$=0.8 V and $V_T$=26 mV, $I_{CQ11}$ becomes about 3.3 mA.

Also, the collector saturation current $I_s$ can be obtained by using following equations (2) and (3):

$$V_{BEQ14} + V_{BEQ15} = R11 \cdot I_{R11} + R_{12} \cdot I_{R12} \cdots \quad (2)$$

where $V_{BEQ14}$ and $V_{BEQ15}$ are the base-emitter voltages of the transistors Q14 and Q15, respectively, and, $I_s$ is the collector saturation current of the transistor Q14 or Q15.

$$I_{CQ14} = I_{CQ15} = I_s \cdot \exp\left(\frac{V_{BE}}{V_T}\right) \approx 66.6 \,\mu A \quad (3)$$

From equations (2) and (3), if $V_{BEQ13}$ is 0.8 V, and the resistance values of R11–R14 are 30, 14 and 30 KΩ respectively, $I_{R13}$ becomes 26.7 μA. The collector current $I_{CQ13}$ of the transistor Q13 can be also obtained by using the following equation (4):

$$I_{CQ13} = I_{SQ13} \cdot \exp\left(\frac{V_{BE}}{V_T}\right) \quad (4)$$

where $I_{SQ13}$ the collector saturation current of the transistor Q13, $V_{BE}$ the base-emitter voltage thereof and $V_T$ the thermal voltage thereof. Since the transistor Q13 then is at saturation state, a current gain β thereof becomes considerably low. If β60, the base current $I_{BQ13}$ of the transistor Q13 becomes approximately 50 μA. Therefore, since $I_{R12}I_{R13}$+ $I_{BQ13}-I_{CQ14}$=26.7 μA+50 μA−66.6 μA≅10 μA, and $I_{R11}$= $(2V_{BE} R_{12} IR_{12})/R11$=42 μA, the base current $I_{BQ12}$ of the transistor Q1 2 becomes 32 μA (or 42 μA−10 μA).

On the other hand, if β=100, $I_{CQ12}$ becomes approximately 3.2 mA.

From $V_{BEQ12}=V_T \ln(I_c/I_s)$, $V_{BEQ12}$ of 0.8 V can be obtained. As a result, when the collector voltage $V_{CQ11}$ of the transistor $Q_{11}$ is 2.2 V, the output pulse signal $V_{low}$ having low voltage level of about 0.1 V is generated from the output terminal 3 of the pulse-shaping circuit, as represented in the following equation:

$$V_{low} = I_{CQ11} - V_{R11} - V_{Q12} \cong 0.1 \text{ V} \ldots \quad (5)$$

whereas $V_{R11}$ is the voltage drop across the resistor $R_{11}$ and $VQ_{12}$ is the voltage drop occurring due to the transistor Q12.

As hereinbefore described when the collector current of the transistor Q13 is sufficient, that is, while the transistor Q13 is at saturation state, the pulse signal having a low level of about 0.1 V can be output from the output terminal of the circuit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

I claim:

1. A pulse-shaping circuit comprising:

first switching means for receiving an input pulse signal through an input terminal of said circuit and forming a current flow path between first and second power sources in accordance with a voltage level of said input pulse signal;

voltage dividing means for dividing a source voltage applied through said first switching means into first and second voltage signals while said current flow path is formed;

a load resistor connected to said first power source and in parallel with said first switching means;

second switching means responsive to said second voltage signal, for providing an output pulse signal from an output terminal of said circuit to an external circuit;

current limiting means for constantly limiting an amount of current flowing through said voltage dividing means and enabling said first and second voltage signals to be maintained constant; and output voltage limiting means for supplying a saturating current signal for said second switching means and limiting a voltage level of said output pulse signal in accordance with said first voltage signal, whereby said voltage level of said output pulse signal is lowered to about 0.1 volt when said input pulse signal is at low level.

2. The pulse-shaping circuit as defined in claim 1, wherein said current limiting means comprises two diodes connected in series to each other.

3. The pulse-shaping circuit as defined in claim 2, wherein each of said two diodes comprises an NPN transistor in which a base and a collector thereof are directly connected to each other.

4. The pulse-shaping circuit as defined in claim 1, wherein said output voltage limiting means comprises an NPN transistor having a base receiving said first voltage signal, a collector connected to said first switching means, and an emitter connected to said output terminal of said circuit.

5. The pulse-shaping circuit as defined in claim 1, wherein said first switching means comprises a PNP transistor having an emitter connected to said first power source, a base receiving said input pulse signal of said circuit, and a collector connected to provide a collector voltage thereof to said voltage dividing means.

6. The pulse-shaping circuit as defined in claim 5, wherein said voltage dividing means comprises first, second and third resistors connected in series between the collector of said PNP transistor serving as said first switching means and said second power source, and wherein said first voltage signal is generated from a connection point between said first and second resistors and said second voltage signal is generated from a connection point between said second and third resistors.

7. The pulse-shaping circuit as defined in claim 1, wherein said second switching means comprises an NPN transistor having an emitter connected to said second power source, a base receiving said second voltage signal, and a collector connected commonly to said load resistor and said output terminal of said circuit.

8. A pulse-shaping circuit comprising:

a first transistor having an emitter coupled to a first voltage source and a base coupled to receive an input pulse signal;

a voltage divider coupled between a collector of the first transistor and a second voltage source, the voltage divider being arranged to provide first and second voltage signals at first and second voltage nodes, respectively;

a load resistor coupled between the first voltage source and an output voltage terminal;

a second transistor having a base coupled to the first voltage node, a collector coupled to the collector of the first transistor, and an emitter coupled to the output terminal;

a third transistor having a base coupled to the second voltage node, a collector coupled to the output terminal, and an emitter coupled to the second voltage source; and a current limiter coupled between the collector of the first transistor and the second voltage node in the voltage divider.

9. The pulse-shaping circuit as defined in claim 8 in which the current limiter comprises a diode or diode-coupled transistor.

10. The pulse-shaping circuit as defined in claim 8 in which the first transistor comprises a PNP transistor, the second transistor comprises an NPN transistor, and the third transistor comprises an NPN transistor.

* * * * *